United States Patent
Kosinski

Patent Number: 5,517,739
Date of Patent: May 21, 1996

[54] METHOD OF MAKING A POLARIZATION-SENSITIVE SHEAR WAVE TRANSDUCER

[75] Inventor: John A. Kosinski, Wall Township, N.J.

[73] Assignee: The United States of America as represented by the Secretary of the Army, Washington, D.C.

[21] Appl. No.: 322,651

[22] Filed: Oct. 7, 1994

Related U.S. Application Data

[62] Division of Ser. No. 236,902, Apr. 29, 1994, Pat. No. 5,386,168.

[51] Int. Cl.$^6$ .................................................... H01L 41/22
[52] U.S. Cl. .................. 29/25.35; 310/334; 310/365; 427/100
[58] Field of Search ................... 29/25.35; 427/100; 310/333–336, 365, 366

[56] References Cited

U.S. PATENT DOCUMENTS 4,625,138  11/1986  Ballato ............................ 310/365 X
4,634,913  1/1987  Whatmore et al. .

(List continued on next page.)

OTHER PUBLICATIONS

C. D. J. Emin et al, "The Bulk Acoustic Wave Properties of Lithium Tetraborate", Proceedings of the 37th Annual Frequency Control Symposium, Jun. 1983.

R. C. Peach et al, "High Coupling Piezoelectric Resonators Using Lithium Tetraborate", IEEE Ultrasonics Symposium Proceedings, Oct.–Nov. 1983.

M. Adachi et al, "Temperature Compensated Piezoelectric Lithium Tetraborate Crystal for High Frequency Surface Acoustic Wave and Bulk Wave Device Applications", IEEE Ultrasonics Symposium Proceedings, Oct. 1985.

A. Ballato et al, "Lateral Field Temperature Behavior of Lithium Tetraborate", IEEE Ultrasonics Symposium Proceedings, Oct. 1989.

A. Ballato et al, "Lithium Tetraborate Transducers", IEEE Transactions on Ultrasonics, Ferroelectrics and Frequency Control, vol. 38, No. 1, Jan. 1991.

J. Kosinski et al, "Measured Properties of Doubly-Rotated Dilithium Tetraborate ($Li_2B_4O_7$) Resonators and Transducers", IEEE Transactions on Ultrasonics, Ferroelectrics and Frequency Control, vol. 40, No. 2, Mar. 1993.

J. Kosinski, "Pure Mode Loci for Dilithium Tetraborate Piezoelectric Resonators and Transducers", Ph.D. Dissertation, Rutgers University, May 1993.

*Primary Examiner*—Carl E. Hall
*Attorney, Agent, or Firm*—Michael Zelenka; George B. Tereschuk

[57] ABSTRACT

A Polarization-Sensitive Shear Wave Transducer Structure utilizes a 4 part MuSLE electrode formed on a top surface of a dilithium tetraborate ($Li_2B_4O_7$) substrate that acts as a transducer forming a body. Electrode gaps of the MuSLE electrode are aligned along the $X_1'$ and $X_3'$ axes of the dilithium tetraborate substrate. The substrate orientation is chosen along the degeneracy locus occurring in the primitive region between the end points (YXl) 19° and (YXw) 27°. The body is bonded to a test object and segments of the MuSLE electrode are coupled to a power source allowing an excitation voltage to create a lateral-field driving a shear wave of selectable polarization. The segments of the MuSLE electrode can also be coupled to a means for detecting a voltage allowing a shear wave incident on the transducer to be detected. In another embodiment, the dilithium tetraborate substrate may be oriented in proximity to the degeneracy locus allowing the generation of orthogonally polarized shear waves of two distinct frequencies. Also disclosed is a method of making a Polarization Sensitive Shear Wave Transducer Structure by forming a 4 part MuSLE electrode on the top surface of a piezoelectric substrate that acts as a transducer to form a body that is bonded to a test object and coupled to a power source allowing an excitation voltage to excite an arbitrarily polarized shear wave.

15 Claims, 7 Drawing Sheets

U.S. PATENT DOCUMENTS

| | | | |
|---|---|---|---|
| 4,701,661 | 10/1987 | Warner et al. | 310/360 |
| 4,754,187 | 6/1988 | Kosinski | 310/361 |
| 4,950,937 | 8/1990 | Ballato et al. | |
| 4,990,818 | 2/1991 | Ballato et al. | |
| 5,233,259 | 8/1993 | Krishnaswamy et al. | 310/365 X |
| 5,287,033 | 2/1994 | Morton | 310/366 X |
| 5,321,333 | 6/1994 | Walden et al. | 310/333 |

TOP VIEW

PERSPECTIVE VIEW

METHOD OF MAKING A POLARIZATION-SENSITIVE SHEAR WAVE TRANSDUCER

GOVERNMENT INTEREST

The invention described herein may be manufactured, used and licensed by or for the Government of the United States of America for governmental purposes without the payment to me of any royalties thereon.

RELATED APPLICATION

This is a Divisional application of Ser. No.: 8/236,902, hereinafter the "parent application", which was filed by Applicant on Apr. 29, 1994, now U.S. Pat. No. 5,386,168.

U.S. Patent application Ser. No. 08/229,498 entitled "Crystal Resonator with Multiply Segmented Lateral-Field Excitation (MuSLE) Electrodes," which has been partially assigned to the same assignee, relates to this application.

BACKGROUND OF THE INVENTION

1. Field of the Invention

This invention relates in general to the field of Piezoelectric Transduction. More particularly, this invention relates to the field of Shear Wave Piezoelectric Transducers by providing an apparatus and method for producing polarized shear waves.

2. Description of the Prior Art

Piezoelectric transducers are well known devices having broad applications in the fields of non-destructive test and evaluation, medical ultrasound and materials characterization. Such transducers are employed in the generation and detection of acoustic waves in various media. Piezoelectric transducers can be used to produce both longitudinal and shear waves, with the latter case being of interest here.

An acoustic shear wave is characterized by particle displacements perpendicular to the direction of wave propagation, and is used in numerous types of piezoelectric resonators and transducers. It has been long recognized that the typical shear wave transducer creates in the test object to which the transducer is affixed a single, fixed polarization shear wave response at a given operating frequency. In order to change the polarization of the shear wave in the test object, a transducer must be physically removed from the test object, and then reoriented onto the test object and subsequently rebonded to it. The well-known requirements of removal, reorienting and rebonding a transducer to a test object are disadvantageous because test results obtained at various polarizations are compromised by the degree to which the bonding procedure is not precisely replicated. The compromising of test results because of the limitations of currently available technology has long been understood as a heretofore unavoidable major limitation and an undesirable cost factor.

Those concerned with the development and testing of ultrasonic test and measurement systems have long recognized the need for a structure which has the advantages of improving the accuracy of the ultrasonic tests by eliminating the uncertainties associated with the rebonding procedure, as well as reducing operational costs and complexities associated with that rebonding process. This structure not only has the advantages arising from the elimination of rebonding, but also has the additional advantages of allowing simultaneous measurement of two (2) polarizations. Heretofore, simultaneous measurement of two (2) polarizations required the use of two (2) separate transducers. This invention does not suffer from that disadvantage.

The present invention fulfills this need by providing a Polarization-Sensitive Shear Transducer structure having a MuSLE electrode formed on a substrate with the substrate orientation chosen such that orthogonal shear-wave polarizations are excited by orthogonal lateral-field excitations, thus forming a body that is placed on a test object thereby allowing selective excitation of polarized shear waves.

Examples of dilithium tetraborate plate resonators and transducers may be found in the following references:

R. W. Whatmore and I. M. Young, U.S. Pat. No. 4,634,913, entitled "Application of Lithium Tetraborate to Electronic Devices," issued Jan. 6, 1987;

A. Ballato and J. Kosinski, U.S. Pat. No. 4,950,937, "Method of Making a Resonator from a Boule of Lithium Tetraborate and Resonator So Made," issued Aug. 21, 1990;

A. Ballato and J. Kosinski, U.S. Pat. No. 4,990,818, "Method of Making a Transducer from a Boule of Lithium Tetraborate and Transducer So Made," issued Feb. 5, 1991;

C. D. J. Emin and J. F. Werner, "The Bulk Acoustic Wave Properties of Lithium Tetraborate," Proceedings of the 37th Annual Frequency Control Symposium, June 1983;

R. C. Peach, C. D. J. Emin, J. F. Werner and S. P. Doherty, "High Coupling Piezoelectric Resonators Using Lithium Tetraborate," IEEE Ultrasonics Symposium Proceedings, October–November 1983;

M. Adachi, T. Shiosaki, H. Kobayashi, O. Ohnishi and A. Kawabata, "Temperature Compensated Piezoelectric Lithium Tetraborate Crystal for High Frequency Surface Acoustic Wave and Bulk Wave Device Applications," IEEE Ultrasonics Symposium Proceedings, October 1985;

A. Ballato, J. Kosinski and T. Lukaszek, "Lateral Field Temperature Behavior of Lithium Tetraborate," IEEE Ultrasonics Symposium Proceedings, October 1989;

A. Ballato, J. Kosinski and T. Lukaszek, "Lithium Tetraborate Transducers," IEEE Transactions on Ultrasonics, Ferroelectrics and Frequency Control, Vol. 38, No. 1, January 1991;

J. Kosinski, A. Ballato and Y. Lu, "Measured Properties of Doubly-Rotated Dilithium Tetraborate ($Li_2B_4O_7$) Resonators and Transducers," IEEE Transactions on Ultrasonics, Ferroelectrics and Frequency Control, Vol. 40, No. 2, March 1993; and J. Kosinski, "Pure Mode Loci for Dilithium Tetraborate Piezoelectric Resonators and Transducers," Ph.D. Dissertation, Rutgers University, May 1993.

Further, the MuSLE electrode arrangement described herein may also be found in:

Related Application CECOM Docket No. 4924 Kosinski, Ballato, and Lu entitled "Crystal Resonator with Multiply Segmented Lateral-Field Excitation (MuSLE) Electrodes," which has been partially assigned to the same assignee, wherein I am a coinventor.

The term "plate resonator" as used herein is defined as a structure wherein the lateral dimensions are much larger than the thickness and is considered to encompass not only planar plates, but also plates with a curvature that is appropriate to the ultrasonic imaging task being considered, as well as other shapes and geometries.

SUMMARY OF THE INVENTION

It is an object of this invention to provide a Polarization-Sensitive Shear Wave Transducer Structure wherein a single, mechanically fixed piezoelectric transducer structure produces shear waves with an adjustable polarization.

It is a primary object of this invention to provide a single, mechanically fixed piezoelectric transducer structure producing shear waves with maximum transductions.

It is a another object of this invention to provide a single, mechanically fixed piezoelectric transducer structure producing shear waves by means of lateral-field excitation.

It is also an object of this invention to provide for a method for producing arbitrarily polarized shear waves with a mechanically fixed transducer structure.

To attain these objects, the present invention contemplates making advantageous use of a MuSLE electrode and a dilithium tetraborate substrate to form a structure placed on a test object for the purpose of creating or detecting an acoustic shear wave in the test object.

The present invention fulfills this need by providing a Polarization-Sensitive Shear Wave Transducer structure having a MuSLE electrode formed on a dilithium tetraborate ($Li_2B_4O_7$) substrate forming a body placed on a test object allowing selective excitation of a polarized shear wave. More specifically, the present invention is directed to a Polarization-Sensitive Shear wave Transducer structure having a 4 part MuSLE electrode formed on a dilithium tetraborate substrate, the MuSLE electrode gaps being oriented along the rotated crystallographic axes of the dilithium tetraborate substrate, thereby forming a body which is then attached to a test object with segments of the MuSLE electrode of the body being coupled to a means for generating an excitation voltage wherein a lateral-field excitation excites a polarized shear wave. Although the preferred embodiment contemplates using a 4 part MuSLE electrode along with a dilithium tetraborate substrate, the scope of this invention is not intended to be limited by either the 4 part MuSLE electrode or the dilithium tetraborate substrate, as other types of MuSLE electrodes or substrates with the correct orientations and characteristics may also be advantageously utilized in this invention.

The Polarization-Sensitive Shear Wave Transducer structure of the present invention can be used in the fields of non-destructive test and evaluation, medical ultrasound technology and materials evaluation. Similarly, the present invention may also be used whenever it would be advantageous to change the polarization of the shear wave, and avoid physically removing the transducer from the test object and subsequently reorienting and rebonding to the test object.

In general, the present invention is a structure providing a MuSLE electrode, having a plurality of segments and at least three (3) electrode gaps, formed upon a dilithium tetraborate substrate, the electrode gaps of the MuSLE electrode being aligned along the rotated crystallographic axes of the dilithium tetraborate substrate. The forming of the MuSLE electrode on the dilithium tetraborate substrate forms a body that is then attached to a test object, said segments of the MuSLE electrode of the body being coupled to a means for generating an excitation voltage in order to create a lateral-field excitation voltage to excite a polarized shear wave.

In the preferred embodiment, a 4 part MuSLE electrode is provided having electrode gaps aligned along $X_1'$ and $X_3'$ axes of a dilithium tetraborate substrate. The dilithium tetraborate substrate acts as a plate resonator, having an upper surface, a lower surface, a set of segments which act as electrical terminals, an outer edge, a center portion and said plurality of electrode gaps forming a body. Said dilithium tetraborate substrate exhibits degenerate shear modes by choice of a substrate orientation along the degeneracy locus, said locus occurring in the primitive region between the end point orientations (YXl) 19° and (YXw) 27°. The body is bonded to a test object, and shear waves are produced by coupling said segments to a means for generating an excitation voltage in order to create a lateral-field excitation in either the $X_1'$ axis direction that excites an $X_1'$ polarized shear wave, the $X_3'$ axis direction that excites an $X_3'$ polarized shear wave, or any combination thereof. In a similar fashion, the preferred embodiment is used for shear wave detection by coupling said segments to a means for detecting rather than generating an excitation voltage.

In this and other embodiments of this invention, various orientations along the degeneracy locus will exhibit different polarized shear wave driving characteristics allowing the choice of substrate orientation to be tailored for specific applications. Additionally, substrate orientations near, but not exactly on, the degeneracy locus also exhibit useful properties. These variations of substrate orientation as regards being on, or near, the degeneracy locus are considered to be within the scope of this disclosure and the appended claims, and will be further described below.

Similarly, substrates other than a dilithium tetraborate substrate may be utilized as a plate resonator, exhibiting very similar characteristics with respect to the propagation of polarized shear waves in the $X_1'$ axis, $X_3'$ axis, or any combination thereof. Such other substrates are also considered to be within the scope of this disclosure and the appended claims.

BRIEF DESCRIPTION OF THE DRAWINGS

The invention will be more fully appreciated from the following detailed description when the same is considered in connection with the accompanying drawings in which.

DETAILED DESCRIPTION OF THE DRAWINGS

Figure 1:
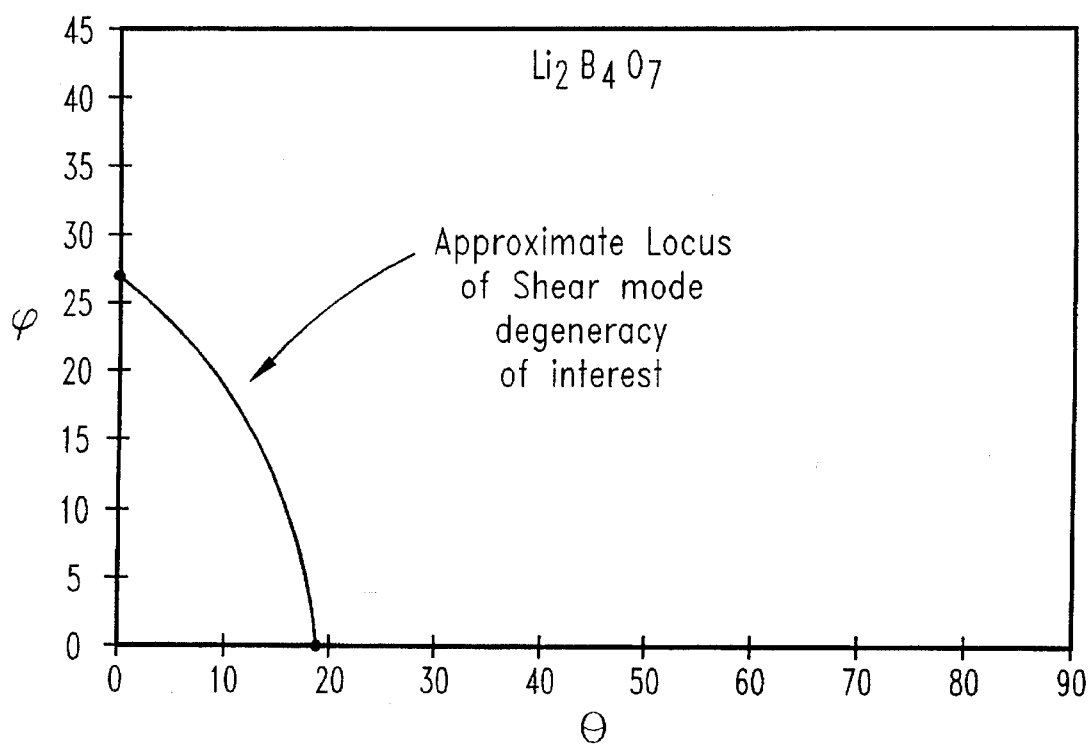
FIG. 1 is a graph useful in understanding that dilithium tetraborate ($Li_2B_4O_7$) piezoelectric material has a locus in the primitive region with end points (YXl) 19° and (YXw) 279° along which shear modes are degenerate.

Referring now to the drawings, FIG. 1 is a graph showing that dilithium tetraborate ($Li_2B_4O_7$) piezoelectric material has a locus in the primitive region with end points at orientations (YXl) 19° and (YXw) 27° along which shear modes are degenerate, which means they have equal wave velocities. This locus also possesses the useful property that shear modes may be driven by lateral-field excitation such that the maximum excitation for one shear mode corresponds to a minimum excitation of the other shear mode. In other words, the shear waves have an inverse relationship where lateral-field excitation is concerned.

Because the polarizations of the shear wave particle displacement are orthogonal and because of the inverse relationship between maximum and minimum lateral-field excitation, a dilithium tetraborate substrate with orientations along the particular locus between the orientation (YXl) 19° and (YXw) 27° makes possible the polarization-sensitive shear transducer that is the preferred embodiment of this invention. It is noted that transducer substrates comprised of other materials are also within the scope of the disclosure and claims of this invention, as described more fully below. The preferred embodiment will be also described in greater detail further below.

Figure 2:
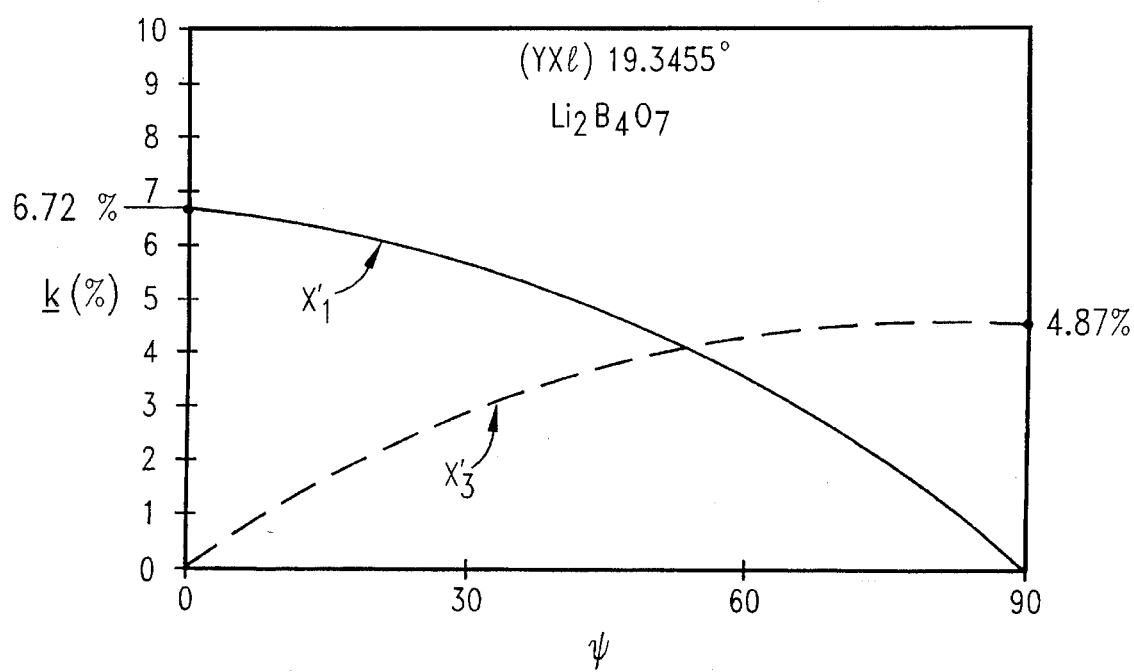
FIG. 2 is a graph useful in understanding that a (YXl) 19.3455° orientation utilized in the preferred embodiment has degenerate shear modes which are driven by orthogonally directed lateral-field excitation components.

The FIG. 2 graph illustrates that a (YXl) 19.3455° orientation has degenerate shear modes which are driven by orthogonally directed lateral-field excitation components. In this orientation the degenerate shear modes travel with a wave velocity of 4476.30 meters per second. In the FIG. 2 graph, the shear mode polarized along the $X_1'$ axis is a pure-mode shear wave. By contrast, the shear mode polarized along the $X_3'$ axis is a quasi-shear mode, that is within 1° of being a pure-mode. Generally speaking, the primary difference between a pure-mode shear wave versus the quasi-shear mode is that the pure-mode shear waves have particle displacements orthogonal to the wave propagation direction, while the quasi-shear mode does not have particle displacement orthogonal to the wave propagation direction. The difference between the behavior of the pure and quasi-shear modes is insignificant for small angular deviations as shown in the preferred embodiment. The $X_1'$ polarized pure-mode is driven by lateral-field excitation along the $X_1'$ axis where $\psi$, which is the angle of the electric field, equals 0°. The $X_3'$ polarized quasi-shear mode is driven by lateral-field excitation along the $X_3'$ axis where $\psi$ equals 90°. Because of these properties, a Polarization-Sensitive Shear Wave Transducer is feasible when an electrode capable of producing a lateral-field excitation of either 0° or 90° is disposed on a substrate with the appropriate orientation characteristics and utilized as a transducer. The Multiply Segmented Lateral Field Excitation ("MuSLE") electrode, has these capabilities and is an integral element of this invention.

Figure 3A:
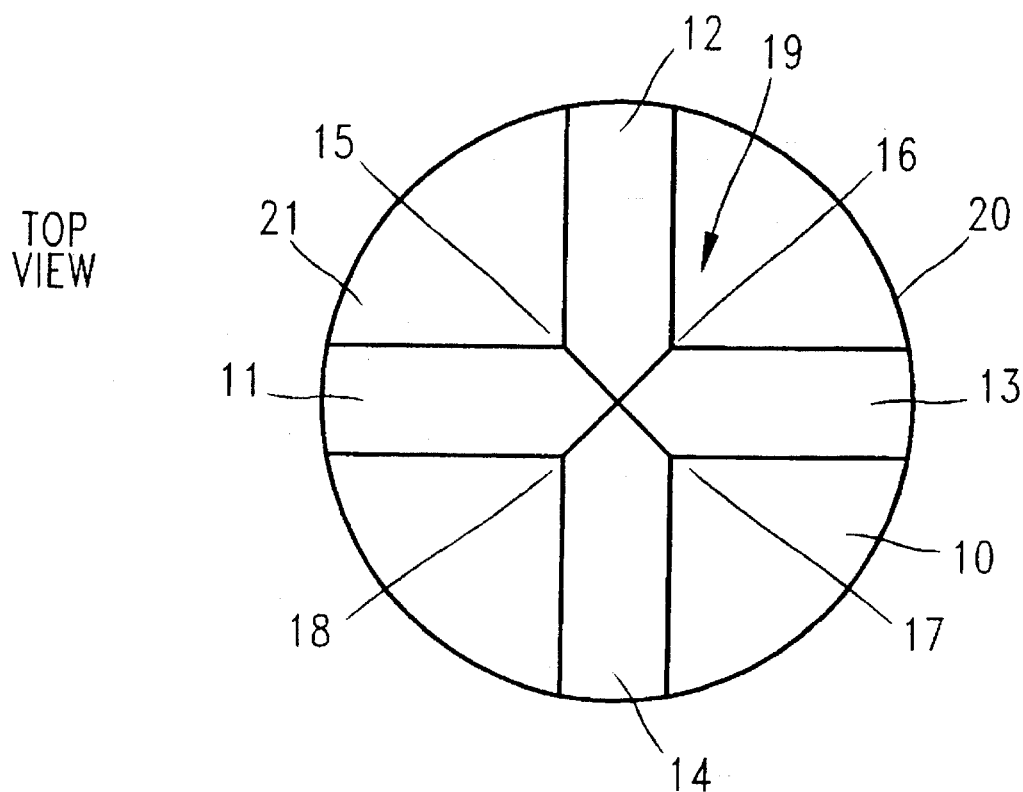
FIGS. 3A and 3B are a top and perspective view of the 4 part MuSLE electrode, respectively, illustrated in all embodiments of this invention.
Figure 3B:
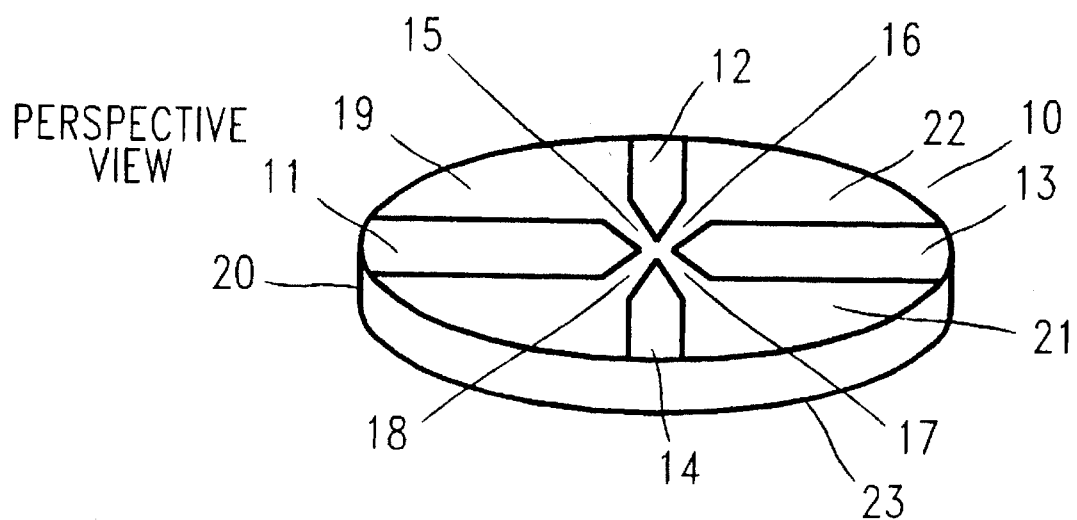

FIGS. 3A and 3B show a top and a perspective view, respectively, of the 4 part MuSLE electrode, which will be described in greater detail along with the preferred embodiment further below. Other configurations of the MuSLE electrode, when combined with a substrate having the appropriate orientation characteristics may also be advantageously utilized, and are considered to be within the scope of the disclosure and the appended claims of this invention.

Figure 4A:
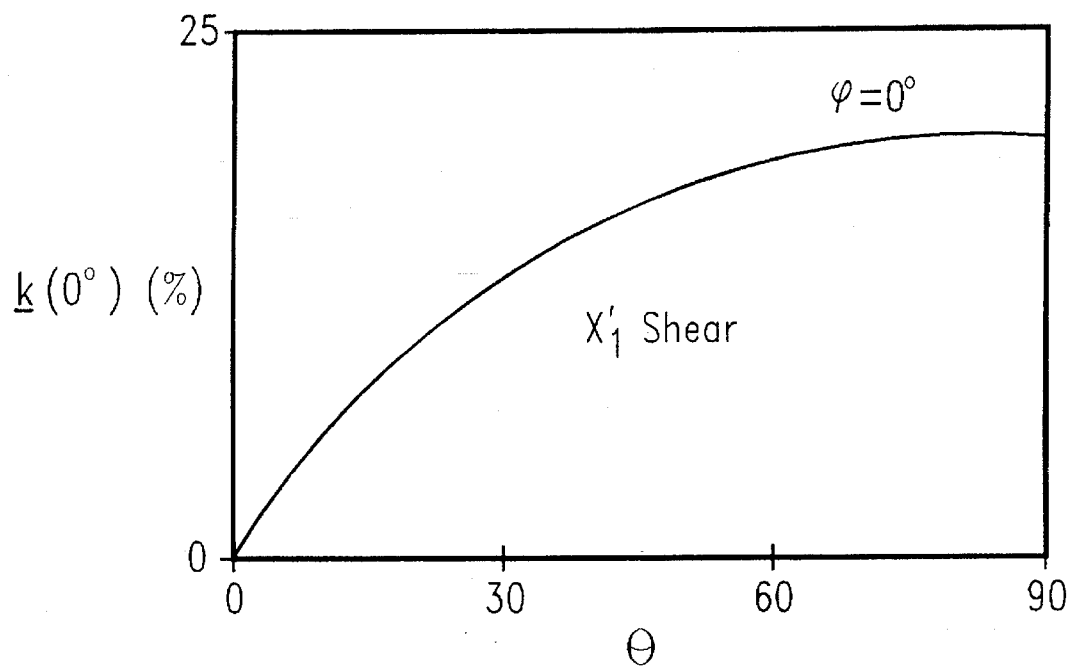
FIGS. 4A and 4B show two (2) graphs useful in understanding the lateral-field excitation piezoelectric coupling coefficient (known as $\underline{k}$) for a dilithium tetraborate substrate where the angle of the electric field, $\psi$ is 0° in FIG. 4A, and $\psi$ is 90° in FIG. 4B.
Figure 4B:
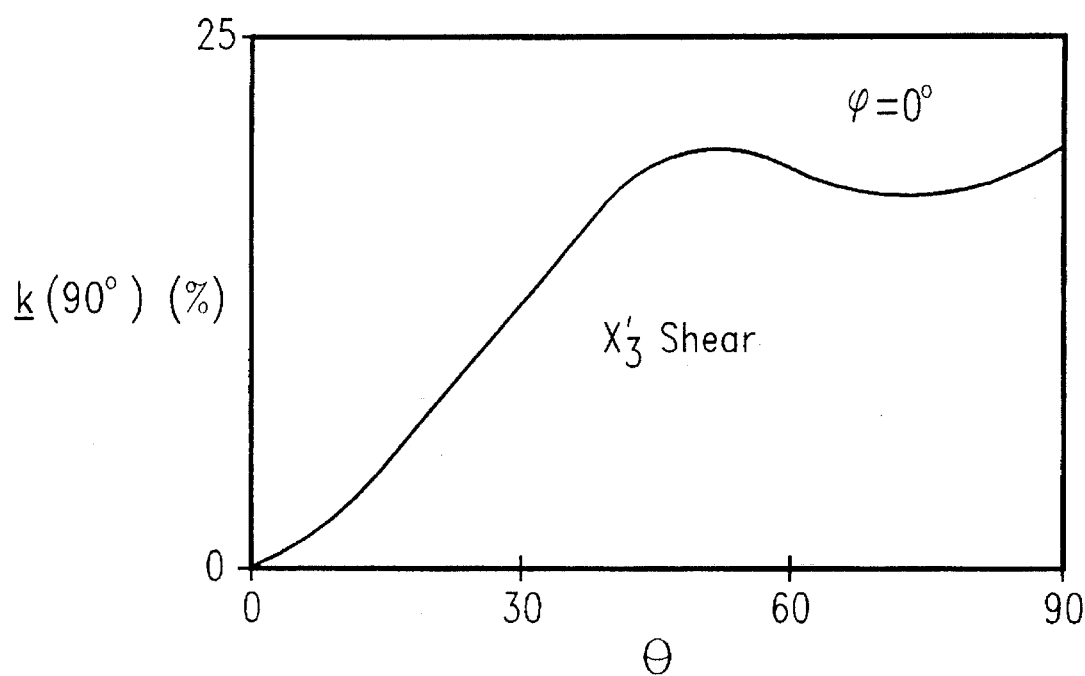

Referring now to FIGS. 4A and 4B, there are two graphs showing the lateral-field excitation piezoelectric coupling coefficient (known as k) as a function of substrate orientation angle of a rotated Y-cut dilithium tetraborate substrate where $\psi$, which is the angle of the electric field is 0° in FIG. 4A, and $\psi$ in FIG. 4B is 90°. FIGS. 4A and 4B show that minimum lateral-field excitation piezoelectric coupling occurs for orientations where θ approaches 0° while the largest piezoelectric coupling occurs when θ approaches 90°. The FIGS. 4A and 4B graphs demonstrate that all orientations for θ>0° along the degeneracy locus are useful in terms of piezoelectric coupling, even if the orientations exhibit lower than the maximum coupling along the degeneracy locus occurring near the (YXl) 19° orientation of the preferred embodiment. Additionally, the FIGS. 4A and 4B graphs show the possible transduction values utilized for other embodiments of this invention.

FIGS. 3A and 3B show a top and a perspective view, respectively, of a 4 part MuSLE electrode 10, having four (4) segments 11, 12, 13 and 14, respectively in a clockwise direction, orthogonally disposed to one another and a plurality of gaps 15, 16, 17 and 18, respectively, separating said segments 11, 12, 13 and 14 where they appear to intersect at the center portion 19 of the electrode 10. The MuSLE electrode 10 is illustrated as formed on a plate resonator 21 comprising a generic substrate in this drawing, with an outer edge 20, upper surface 22 and a lower surface 23. A MuSLE electrode is provided in all embodiments of this invention, and even though a 4 part MuSLE electrode is depicted in FIGS. 3A and 3B, a MuSLE electrode with a greater or lesser number of segments is considered to be within the scope of this disclosure and the appended claims.

Figure 5A:
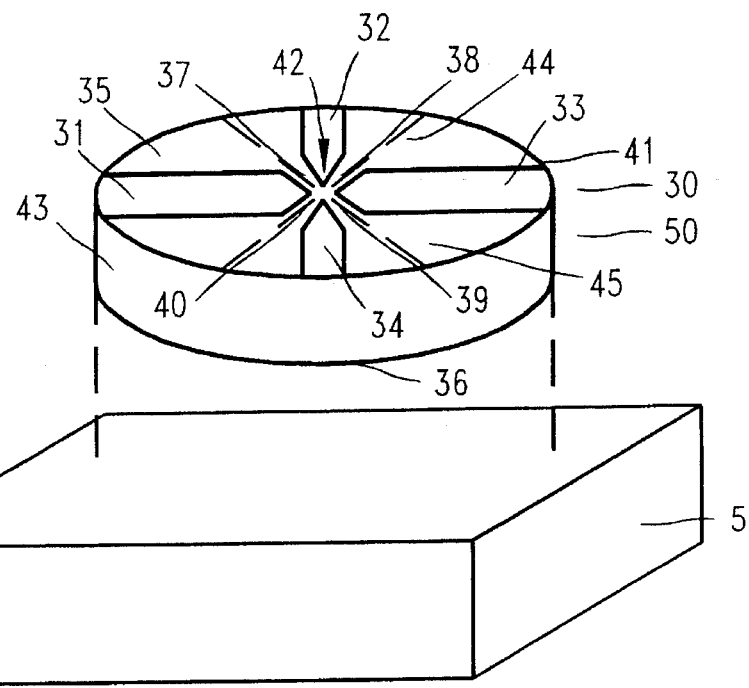
FIGS. 5A and 5B are an exploded perspective view and a perspective/diagrammatic view, respectively, of the preferred embodiment.
Figure 5B:
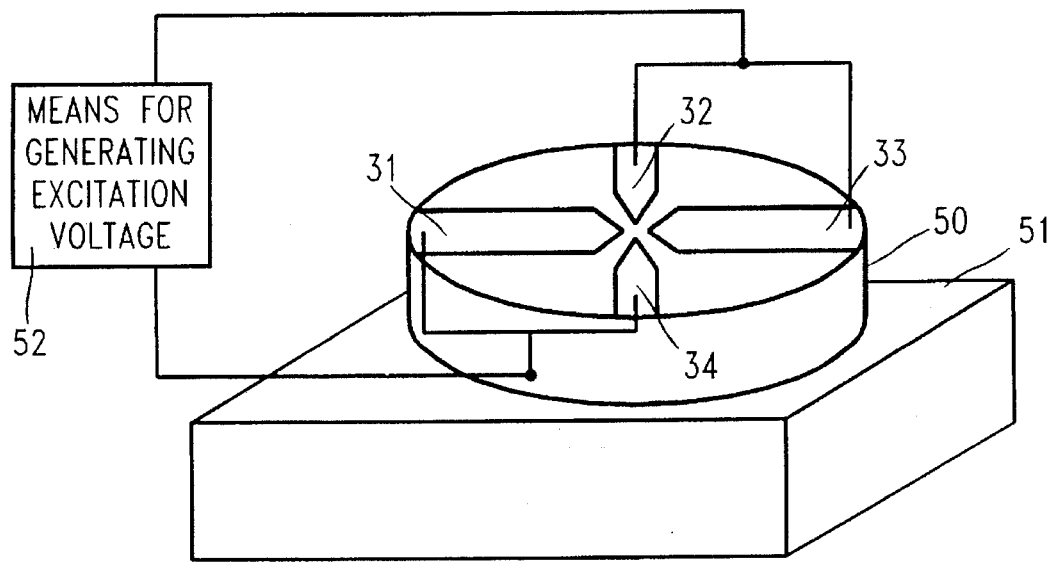

FIGS. 5A and 5B are an exploded perspective view and a perspective/diagrammatic view, respectively, of the preferred embodiment of this invention, where a 4 part MuSLE electrode 30 is provided, having a piezoelectric substrate 43 with predetermined coordinate axes acting as a plate resonator, four (4) segments 31, 32, 33 and 34, respectively in a clockwise direction, disposed on said piezoelectric substrate 43, a top surface 35, a lower surface 36, a plurality of electrode gaps 37, 38, 39, and 40, respectively in a clockwise direction, an outer edge 41, and a center portion 42. Each of the segments 31, 32, 33 and 34 are orthogonally disposed to one another and point inward toward the center portion 42 of the piezoelectric substrate 43 and are separated at the center portion 42 by a plurality of electrode gaps 37, 38, 39 and 40, respectively. In the preferred embodiment, said piezoelectric substrate 43 with predetermined coordinate $X_1'$ axis 44 and an $X_3'$ axis 45 is constructed of dilithium tetraborate ($Li_2B_4O_7$). Said dilithium tetraborate substrate 43 being a transducer and also having an orientation along the degeneracy locus occurring in the primitive regions with end points (YXl) 19° and (YXw) 27° as shown on FIG. 1. Said electrode gaps 37, 38, 39, and 40, respectively, are aligned along said crystallographic $X_1'$ axis 44 and $X_3'$ axis 45 of the dilithium tetraborate substrate 43. Disposing said segments 31, 32, 33 and 34 in this manner on said dilithium tetraborate substrate 43 forms a body 50. Said body 50 being bonded to a test object 51 and an appropriate number of said segments, for example 31 and 34, being coupled to a means for generating an excitation voltage, generally indicated schematically in FIG. 5B by box 52, where for purposes of illustration a lateral-field excitation in the $X_1'$ axis 44 direction excites an $X_1'$ polarized shear wave.

Figure 6A:
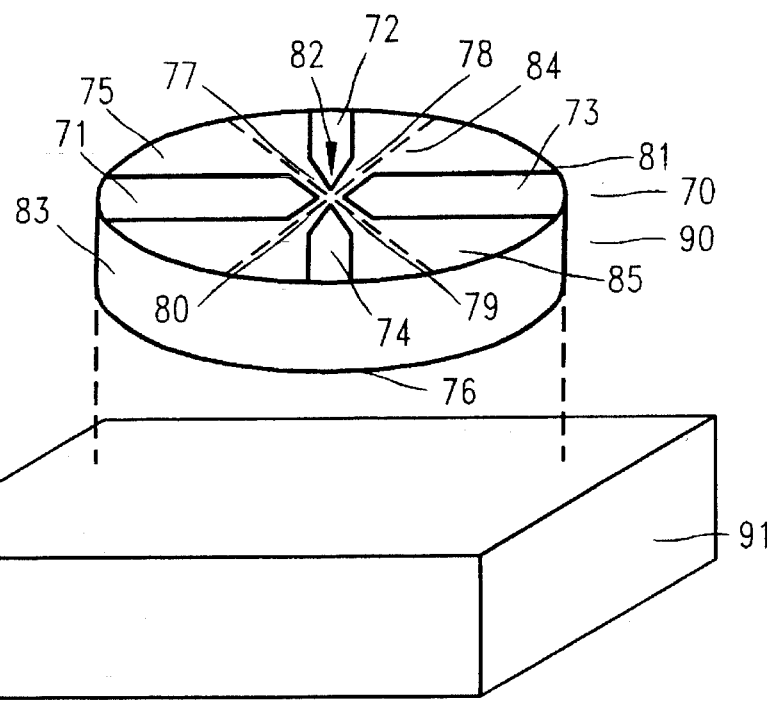
FIGS. 6A–6D show an exploded perspective view, a perspective/diagrammatic view and two (2) schematic views, respectively, of another embodiment of this invention, showing two lateral-field excitation driving voltage arrangements, with the driving fields parallel to the $X_1'$ and $X_3'$ axes, respectively.
Figure 6B:
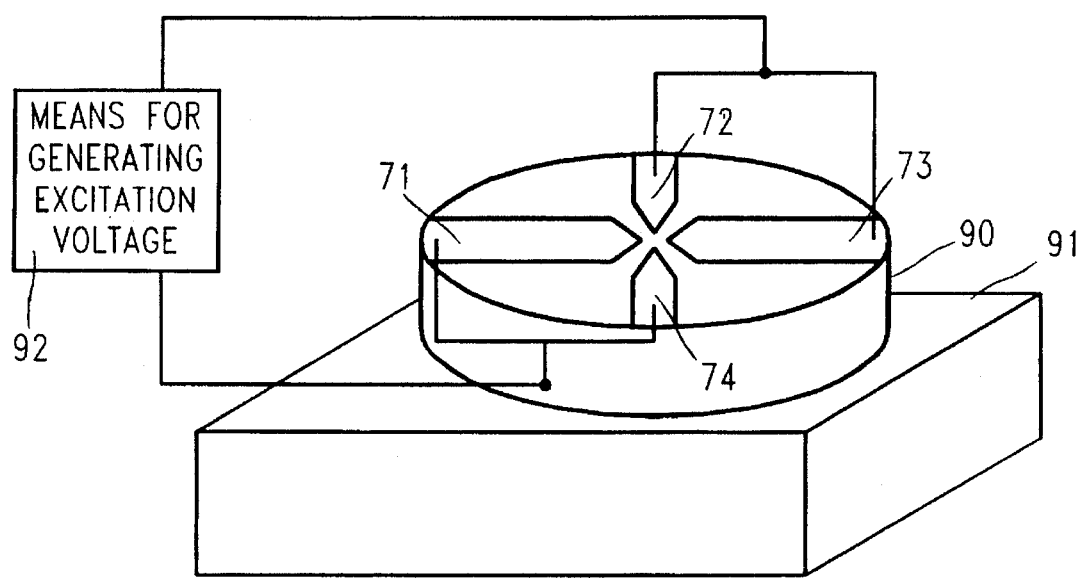

FIGS. 6A–6D show an exploded perspective view, a perspective/diagrammatic view and two (2) schematic views, respectively, of another embodiment of this invention, indicating a structure that will generate, respectively, either $X_1'$ or $X_3'$ polarized shear waves, through the choice of connection between the electrode segments and the means for generating an excitation voltage. In this embodiment, which provides the same basic configuration as shown in FIGS. 5A and 5B, as depicted in FIG. 6A, a 4 part MuSLE electrode 70 is provided, having a piezoelectric substrate 83, with predetermined coordinate axes acting as a plate resonator, four (4) segments 71, 72, 73 and 74, respectively in a clockwise direction, being disposed on said piezoelectric substrate 83. Said piezoelectric substrate 83, having a top surface 75, a lower surface 76, a plurality of electrode gaps 77, 78, 79, and 80, respectively in a clockwise direction, an outer edge 81, and a center portion 82. Each of said segments 71, 72, 73 and 74 are orthogonally disposed to one another on the top surface 73 and point inward toward the center portion 82, where each of said segments 71, 72, 73 and 74, respectively, are separated at the center portion 82 by said plurality of electrode gaps 77, 78, 79 and 80, respectively. In this embodiment, said piezoelectric substrate 83 with predetermined coordinate $X_1'$ axis 84 and an $X_3'$ axis 85 is constructed of dilithium tetraborate ($Li_2B_4O_7$). Said piezoelectric substrate 83 being a transducer and also having an orientation near the degeneracy locus occurring in the primitive regions with end points (YX1) 19° and (YXw) 27°. Said electrode gaps 77, 78, 79, and 80, respectively, being aligned along the crystallographic $X_1'$ axis 84 and $X_3'$ axis 85 of the dilithium tetraborate substrate 83. Forming said segments 71, 72, 73 and 74 and said electrode gaps 77, 78, 79, and 80, in this manner on said dilithium tetraborate substrate 83 forms a body 90, said body 90 being bonded to the test object 91. FIG. 6B is a perspective/diagrammatic view of this embodiment coupled to a means for generating an excitation voltage, generally indicated schematically as box 92.

Figure 6C:
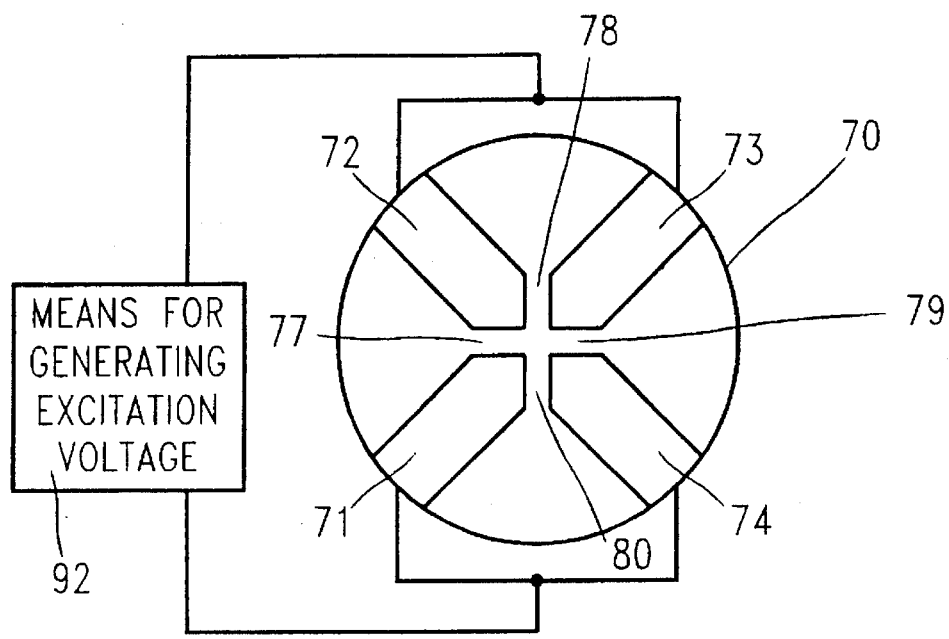
Figure 6D:
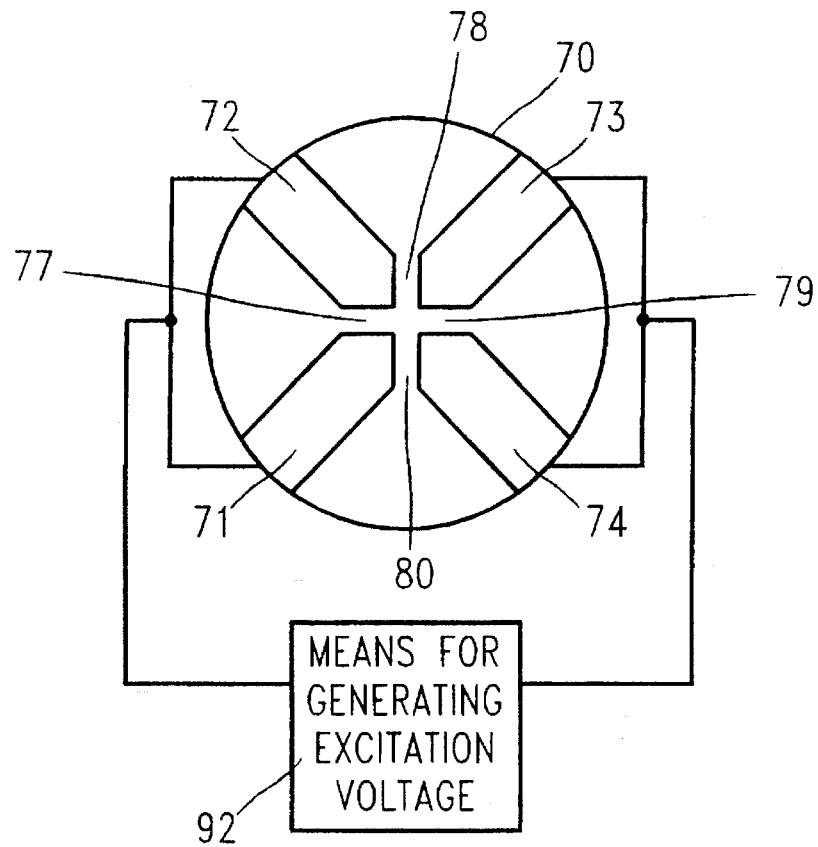

In operation and in taking said segments 71 and 74 as a pair and said segments 72 and 73 as another pair, as shown in FIG. 6C, said segments 71 and 74 are coupled to a means for generating an excitation voltage, generally indicated schematically in FIGS. 6B and 6C as box 92, and the excitation voltage is applied to the Polarization-Sensitive Shear Wave Transducer structure creating a lateral-field excitation along the $X_1'$ axis 84 direction that excites a $X_1'$ polarized shear wave. Similarly, in operation and in taking said segments 71 and 72 as a pair and said segments 73 and 74 as another pair, as shown in FIG. 6D, said segments 71 and 72 are coupled to said means for generating an excitation voltage, generally indicated schematically as box 92 in FIGS. 6B and 6D, and the excitation voltage is applied to the Polarization-Sensitive Shear Wave Transducer structure creating a lateral-field excitation along the $X_3'$ axis 85 direction that excites a $X_3'$ polarized shear wave.

In both the preferred and other embodiments, the top surface of the substrate may be flat or curved, in the form of a wafer, or in an annular or disc shape. Further, the electrode gaps may either be aligned along the $X_1'$ and $X_3'$ axes, or near those axes. The MuSLE electrode must have at least three (3) segments, and may have four (4), six (6) or more segments. The segments may be in a generally linear structure extending from the center portion of the substrate to its outer edge. Additionally, this invention may also include combining a number of MuSLE electrodes in different configurations such as, by way of example, disposing a plurality of MuSLE electrodes on top of each other when forming the body. Further, in both the preferred and other embodiments, the segments may be formed on the top surface of the substrate by any deposition technique such as, by way of example, electroplating, using a vacuum evaporation chamber or electron beam evaporation. Additionally, the body may be bonded to the test piece using an adhesive. Though a dilithium tetraborate piezoelectric substrate with a particular orientation is disclosed as the preferred embodiment, both dilithium tetraborate substrates with other orientations, as well as other piezoelectric substrates with a suitable orientation, may also be advantageously employed in accordance with this invention and are considered to be within the scope of this disclosure and the appended claims.

Finally, the structures of both the preferred and other embodiments of this invention can be advantageously employed to not only excite polarized shear waves, but also to detect and measure polarized shear waves as they travel through a medium.

The present invention also encompasses a method of making a Polarization-Sensitive Shear Wave Transducer (PSST), utilizing the previously described configurations which comprises the steps of forming a MuSLE electrode by depositing a plurality of electrode segments on a piezoelectric substrate with predetermined coordinate axes, forming said MuSLE electrode with said electrode segments being separated by a plurality of electrode gaps, said piezoelectric substrate being a transducer, aligning the electrode gaps to intersect the predetermined $X_1'$ and $X_3'$ axes of the piezoelectric substrate, thereby forming a body, bonding said body to a test object and coupling a pair of segments to a means for generating an excitation voltage in order to create either a lateral-field excitation in the $X_1'$ axis direction that will excite an $X_1'$ polarized shear wave, a lateral-field excitation in the $X_3'$ axis direction that will excite an $X_3'$ polarized shear wave or a combination of lateral-field excitation in the $X_1'$ and $X_3'$ directions that will excite a shear wave of arbitrary polarization, or coupling a pair of segments to a means for detecting lateral-field excitation voltages produced by incident shear waves.

The method of this invention may also include forming the top surface of the substrate to be flat or curved, forming the substrate in the shape of a wafer, or in an annular or disc shape. Further, the electrode gaps may be either aligned along the $X_1'$ and $X_3'$ axes or near those axes, the MuSLE electrode must be formed with at least three (3) segments, and may be formed with four (4), six (6) or more segments. The segments may be formed to extend from the center portion of the substrate to its outer edge in a generally linear manner or to be combined in different ways. Additionally, the method of this invention may also include combining a number of MuSLE electrodes in different configurations such as, by way of example, disposing a plurality of MuSLE electrodes on top of each other when forming the body. Further, the segments may be formed on the top surface of the substrate by any deposition technique such as, by way of example, electroplating, using a vacuum evaporation chamber or electron beam evaporation. Further, the body may be bonded to the test piece using an adhesive. Though a dilithium tetraborate piezoelectric substrate with a particular orientation is disclosed as the piezoelectric substrate utilized in the method of this invention, both dilithium tetraborate substrates with other orientations, as well as other piezoelectric substrates with a suitable orientation may also be advantageously employed in accordance with the method of this invention and are considered to be within the scope of this disclosure and the appended claims.

Finally, the method of this invention can be advantageously employed to not only excite polarization shear waves, but also to detect and measure polarization shear waves as they travel through a medium.

Accordingly, having shown and described what is at present considered to be the preferred and several embodiments of this invention, it should be understood that the same has been shown by way of illustration and not limitation. It should be understood, of course, that the foregoing disclosure relates only to a small number of preferred embodiments and that numerous modifications or alterations may be made therein without departing from the spirit and scope of the inventions as set forth in this disclosure and the appended claims. All modifications, alterations and changes coming within the spirit and scope of the invention are hereby meant to be included.

What I claim is:

1. A method of preparing a Polarization-Sensitive Shear Wave Transducer Structure for ultrasonic testing of material properties comprising the steps of:

depositing a plurality of electrode segments onto a piezoelectric plate substrate, said piezoelectric plate substrate being a transducer, having a top surface, a bottom surface, predetermined $X_1'$ and $X_3'$ axes, and a substrate orientation along a shear wave degeneracy locus, said axes being at right angles to each other;

forming a Multiply Segmented Lateral-Field Excitation (MuSLE) electrode, by disposing said electrode segments on said top surface of the substrate to form a body, said segments being mutually separated by a plurality of electrode gaps;

aligning said electrode gaps along said $X_1'$ and $X_3'$ axes of the substrate;

bonding said body to a test object;

selecting one of said axes; and coupling means for generating an excitation voltage across said segments wherein a lateral-field excitation voltage along one of said preselected axes generates a correspondingly polarized acoustic shear wave.

2. A method of preparing a Polarization-Sensitive Shear Wave Transducer Structure for ultrasonic testing of material properties as recited in claim 1, further comprising forming a flat top surface of said substrate.

3. A method of preparing a Polarization-Sensitive Shear Wave Transducer Structure for ultrasonic testing of material properties as recited in claim 2, further comprising forming said substrate in the shape of a wafer.

4. A method of preparing a Polarization-Sensitive Shear Wave Transducer Structure for ultrasonic testing of material properties as recited in claim 3, further comprising forming said substrate in the shape of a disc.

5. A method of preparing a Polarization-Sensitive Shear Wave Transducer Structure for ultrasonic testing of material properties as recited in claim 4, further comprising bonding said body to said test object by using an adhesive.

6. A method of preparing a Polarization-Sensitive Shear Wave Transducer Structure for ultrasonic testing of material properties as recited in claim 5, further comprising selecting said substrate orientation in proximity to said shear wave degeneracy locus.

7. A method of preparing a Polarization-Sensitive Shear Wave Transducer Structure for ultrasonic testing of material properties as recited in claim 5, further comprising said MuSLE electrode having at least three segments.

8. A method of preparing a Polarization-Sensitive Shear Wave Transducer Structure for ultrasonic testing of material properties as recited in claim 5, further comprising forming said MuSLE electrode by depositing four segments on said top surface of the substrate.

9. A method of preparing a Polarization-Sensitive Shear Wave Transducer Structure for ultrasonic testing of material properties as recited in claim 5, further comprising forming said MuSLE electrode by depositing six segments on said top surface of the substrate.

10. A method of preparing a Polarization-Sensitive Shear Wave Transducer Structure for ultrasonic testing of material properties as recited in claim 5, which comprises:

said substrate having an outer edge and a center portion;

shaping said segments in a generally linear manner;

arranging said segments to extend radially outward from said center portion to said outer portion of said substrate; and selecting said substrate orientation relative to said axes.

11. A method of preparing a Polarization-Sensitive Shear Wave Transducer Structure for ultrasonic testing of material properties as recited in claim 10, further comprising generating said lateral-field excitation voltage along said $X_3'$ axis to generate said correspondingly polarized acoustic shear wave.

12. A method of preparing a Polarization-Sensitive Shear Wave Transducer Structure for ultrasonic testing of material properties as recited in claim 10, further comprising generating said lateral-field excitation voltage simultaneously along said $X_1'$ and $X_3'$ axes to generate said correspondingly polarized acoustic shear waves.

13. A method of preparing a Polarization-Sensitive Shear Wave Transducer Structure for ultrasonic testing of material properties as recited in claim 10, further comprising generating said lateral-field excitation voltage along said $X_1'$ axis to generate said correspondingly polarized acoustic shear wave.

14. A method of preparing a Polarization-Sensitive Shear Wave Transducer Structure for ultrasonic testing of material properties as recited in claim 13, further comprising coupling means for detecting said excitation voltage across said segments wherein said $X_1'$ polarized acoustic shear wave generates said $X_1'$ lateral-field excitation voltage.

15. A method of preparing a Polarization-Sensitive Shear Wave Transducer Structure for ultrasonic testing of material properties as recited in claim 1, further comprising coupling means for detecting said excitation voltage across said segments wherein said $X_3'$ polarized acoustic shear wave generates said $X_3'$ lateral-field excitation voltage.

* * * * *

UNITED STATES PATENT AND TRADEMARK OFFICE
CERTIFICATE OF CORRECTION

PATENT NO. : 5,517,739

DATED : May 21, 1996

INVENTOR(S) : John A. Kosinski

It is certified that error appears in the above-identified patent and that said Letters Patent is hereby corrected as shown below:

Column 10, line 46, "in claim 1" should read --in claim 11--.

Signed and Sealed this

Fourth Day of February, 1997

Attest:

Attesting Officer

BRUCE LEHMAN

Commissioner of Patents and Trademarks